United States Patent [19]
Iwasa

[11] Patent Number: 5,381,028
[45] Date of Patent: Jan. 10, 1995

[54] NONVOLATILE SEMICONDUCTOR MEMORY WITH RAISED SOURCE AND DRAIN

[75] Inventor: Shoichi Iwasa, Tokyo, Japan

[73] Assignee: Nippon Steel Corporation, Tokyo, Japan

[21] Appl. No.: 183,852

[22] Filed: Jan. 21, 1994

[30] Foreign Application Priority Data

Jan. 21, 1993 [JP] Japan .................. 5-027463

[51] Int. Cl.⁶ .......................................... H01L 29/78
[52] U.S. Cl. ...................... 257/316; 257/322; 257/382; 257/754
[58] Field of Search ............ 257/316, 315, 314, 321, 257/322, 382, 754, 900; 365/185; 437/162, 950

[56] References Cited

U.S. PATENT DOCUMENTS

| | | | |
|---|---|---|---|
| 5,045,901 | 9/1991 | Komori et al. | 257/382 |
| 5,175,118 | 12/1992 | Yoneda | 437/162 |
| 5,270,232 | 12/1993 | Kimura | 437/162 |

FOREIGN PATENT DOCUMENTS

3-44971  2/1991  Japan ................ 365/185

OTHER PUBLICATIONS

16M EPROM Cell Technology, Nikkei Micro Devices, Jan. 1990, pp. 101–107.

*Primary Examiner*—Robert P. Limanek
*Attorney, Agent, or Firm*—Pollock, Vande Sande & Priddy

[57] ABSTRACT

The MOS field-effect transistor has a semiconductor substrate of a first conductivity type, a pair of first polycrystalline silicon layers of a second conductivity type different from the first conductivity type which are formed on the semiconductor substrate and separated from each other by a small gap, a pair of diffusion layers of the second conductivity type formed in those regions of the semiconductor substrate which are in contact with the pair of first polycrystalline silicon layers, respectively, a gate insulating film formed to cover the pair of first polycrystalline silicon layers of the second conductivity type and a part of the semiconductor substrate exposed to an outside at the small gap, and a gate electrode formed on the gate insulating film. The nonvolatile semiconductor memory device is arranged by using the MOS field-effect transistor mentioned above.

11 Claims, 3 Drawing Sheets

NONVOLATILE SEMICONDUCTOR MEMORY WITH RAISED SOURCE AND DRAIN

BACKGROUND OF THE INVENTION

1. Field of the Invention

This invention relates to MOS field-effect transistors and a nonvolatile semiconductor memory device using the same, and particularly to those suitable for use in the stacked-gate EEPROM (Electrically Erasable Programmable ROM) and EPROM (Erasable Programmable ROM).

2. Description of Related Art

The conventional MOS field-effect transistor and nonvolatile semiconductor memory device are described in, for example, "16M EPROM cell technology", NIKKEI MICRO DEVICES January, 1990 p.p. 101–107. According to this document, the MOS field-effect transistor and nonvolatile memory device are built up by injecting impurity ions of a second conductivity type into a semiconductor substrate of a first conductivity type, thereby forming a pair of second conductivity type diffusion layers so that the layers are separated from each other by a certain distance, serving as source and drain regions. Therefore, this structure tends to increase the junction depth of the second conductivity type diffusion layers and the channel-wise width of the tunnel window in the overlapped region between the diffusion layer and the gate.

For example, the junction depth of the second conductivity type diffusion layers in the conventional MOS field-effect transistor is 0.2 through 0.3 $\mu$m, and the channel-wise width of the tunnel window is 0.05 through 0.1 $\mu$m.

In addition, the electrode layers are formed to be made in contact with the parts of the second conductivity type diffusion layers which are in contact with the active region. The channel length is about 0.6 $\mu$m in the 16-MB class.

Thus, the conventional MOS field-effect transistor and the nonvolatile semiconductor memory device using the same have the defect that the junction depth of the diffusion layer, the spread of the source-side depletion layer to the drain side and the spread of the drain-side depletion layer to the source side become so great as to cause the punch-through phenomenon easily since the second conductivity diffusion layers are formed as drain and source regions by the ion implantation as described above.

In addition, since the lateral diffusion of second conductivity type diffusion layer is increased with the increase of its junction depth, the tunnel window in the flash EEPROM is extended with the result that the erase efficiency is low. Also, when the lateral diffusion is much spread, the short channel effect may easily occur, thus limiting the minimum channel length. This lower limit of the channel length is disadvantageous to the miniaturization of the transistor elements.

Moreover, since the external electrode is in contact with only a part of the second conductivity type diffusion layer, it is difficult to reduce the contact resistance.

Furthermore, since the second conductivity type diffusion layers are formed by the ion implantation, a crystal defect may easily occur in the diffusion layers.

SUMMARY OF THE INVENTION

It is an object of the invention to provide a MOS field-effect transistor with less crystal defects, high erase efficiency and short channel length advantageous to the miniaturization of the elements, and a nonvolatile semiconductor memory device using the same.

In order to achieve the above object, a MOS field-effect transistor of the invention has a semiconductor substrate of a first conductivity type, a pair of first polycrystalline silicon layers of a second conductivity type different from the first conductivity type which are formed on the semiconductor substrate and separated from each other by a very small gap, a pair of diffusion layers of the second conductivity type formed in those regions of the semiconductor substrate which are in contiguous to the first polycrystalline silicon layers, respectively, a gate insulating film formed to cover the pair of first polycrystalline silicon layers of the second conductivity type and a part of the semiconductor substrate which is exposed to an outside at the very small gap, and a gate electrode formed on the gate insulating film.

In addition, a nonvolatile semiconductor memory device of the invention has a semiconductor substrate of a first conductivity type, an element isolation insulating film formed in the semiconductor substrate in order to define an active region in the semiconductor substrate, a pair of first polycrystalline silicon layers including impurities of a second conductivity type different from the first conductivity type which are formed on an active region of the semiconductor substrate and separated from each other by a very small gap, a pair of diffusion layers of the second conductivity type formed in those regions of the semiconductor substrate which are in contiguous to the first polycrystalline silicon layers, respectively, by diffusing the impurities contained in the first polycrystalline silicon layers, an interlayer insulating film formed to cover the pair of second conductivity type first polycrystalline silicon layers and a part of the semiconductor substrate which is exposed to an outside at the very small gap between the first polycrystalline silicon layers, a portion of the interlayer insulating film which covers the exposed part of the semiconductor substrate exposed to the outside at the very small gap being used as a first gate insulating film, a floating gate electrode formed on the interlayer insulating film so as to cover the very small gap, a second insulating film formed on the floating gate electrode, and a control gate electrode formed on the second gate insulating film.

The floating gate is formed of, preferably, a polycrystalline silicon layer of the second conductivity type. The control gate electrode is formed of, preferably, a double layer polycrystalline-silicide structure of a second conductivity type polycrystalline silicon layer and a silicide. The term "polycrystalline-silicide" is hereinafter abbreviated as "polycide".

In addition, it is desired to form sidewalls on the portions of the interlayer insulating film which vertically extend at the very small gap. The junction depth of the second conductivity type diffusion layers should be 0.05 $\mu$m or less.

In any one of the MOS field-effect transistor and the nonvolatile semiconductor memory device, the second conductivity type diffusion layers are formed by diffusing the second conductivity type impurities of the first polycrystalline silicon layers into the substrate. This impurity diffusion can be effected by the thermal oxidization process within a steam of 800° C. for producing the interlayer insulating film on the first polycrystalline silicon layers, and by the following nitrogen atmosphere high-temperature annealing process at 900° C. for 10 minutes. Thus, a crystal defect can be prevented from occurring in the diffusion layers.

Since the diffusion layers can be formed so that the junction depth is 0.05 μm or, the lateral spread of the diffused region can be reduced. Thus, the channel length can be decreased, and thus this feature is advantageous to the miniaturization of elements, and moreover, since the tunnel window is small, the erase efficiency in the flash EEPROM can be increased. In addition, the spread of the source side depletion layer to the drain side and the spread of the drain side depletion layer to the source side are reduced, and thus almost no punch through phenomenon occurs.

Also, when sidewalls are formed on the vertically extending portions of the interlayer insulating film, the very small gap width is decreased by an amount corresponding to the thicknesses of the side walls, and thus the channel length can be further made shorter than the lower limit of the channel length which can be made by the photolithography.

Furthermore, since the second conductivity type first polycrystalline silicon layers are formed on all the surface of the diffusion layers for the drain and source regions, the contact resistance can be reduced when an aluminum electrode layer is connected to the first polycrystalline silicon layers.

DESCRIPTION OF THE PREFERRED EMBODIMENTS

Figure 1:
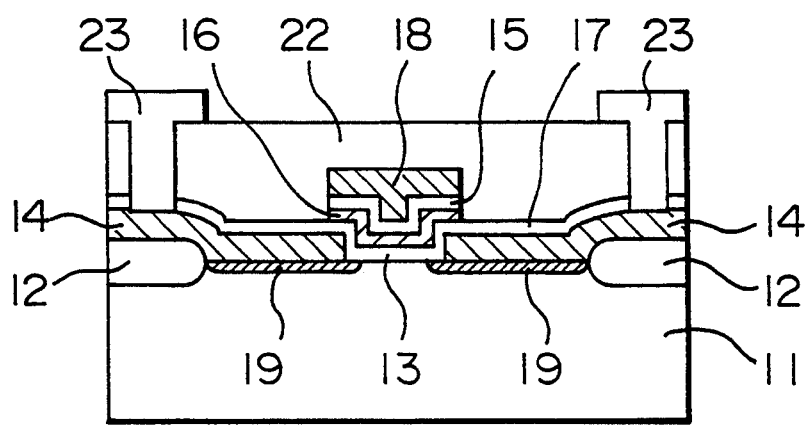
FIG. 1 is a cross-sectional view showing the structure of a nonvolatile semiconductor memory device of one embodiment of the invention.

FIG. 1 shows the structure of a nonvolatile semiconductor memory device of one embodiment of the invention. FIGS. 2A through 2F are diagrams showing the steps in production of this nonvolatile semiconductor memory device.

Figure 2A:
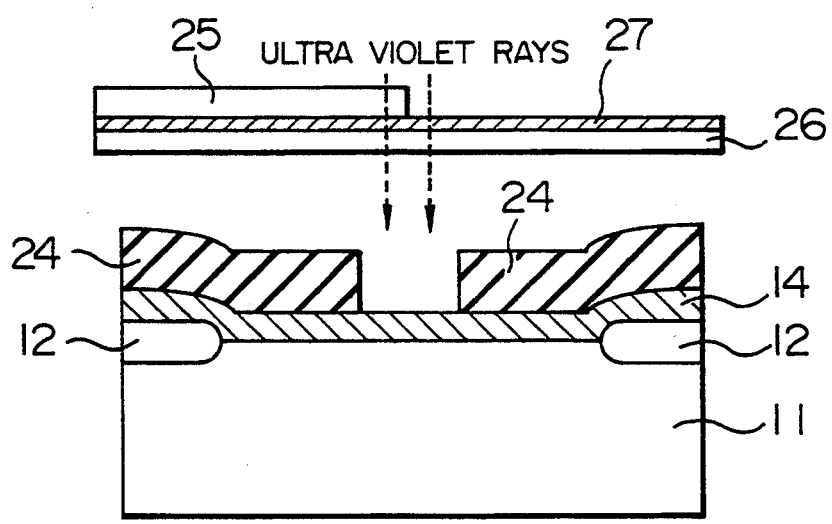
FIGS. 2A through 2F are diagrams showing the steps in production of the nonvolatile semiconductor memory device shown in FIG. 1.

When the nonvolatile semiconductor memory device shown in FIG. 1 is produced, an element isolation insulating film 12 is first formed in a semiconductor substrate 11 of a first conductivity type, for example, P type by selective oxidation, thereby defining an active region. Then, a first polycrystalline silicon layer 14 of, for example, a second conductivity, or N type is deposited over the entire surface of the first conductivity type semiconductor substrate 11 by the well-known chemical vapor phase deposition, and a photoresist 24 is deposited on the entire surface of the second conductivity type first poly-crystalline silicon layer 14. Thereafter, when the photoresist is exposed to ultraviolet rays through a quartz mask 26 which has a chromium film 27 and a phase shifter 25 successively formed on its surface, a part of the photoresist 24 which lies just under the edge of the phase shifter 25 is removed so that a very small gap having a width of about 0.2 μm, is formed in the photoresist layer. Thus, the second conductivity type first polycrystalline silicon layer 14 is exposed to the outside at the gap (FIG. 2A).

Figure 2B:
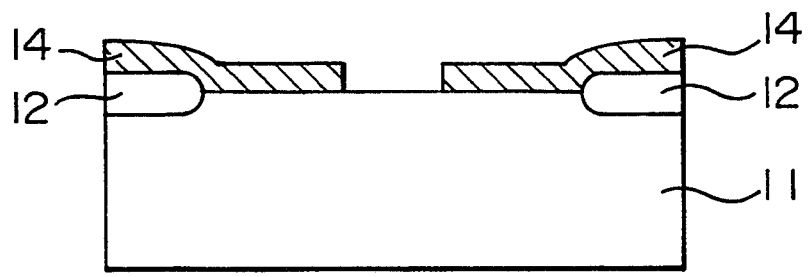

The second conductivity type first polycrystalline layer 14 is then patterned by the anisotropic dry etching process by using the photoresist 24, as a mask (FIG. 2B).

Figure 2C:
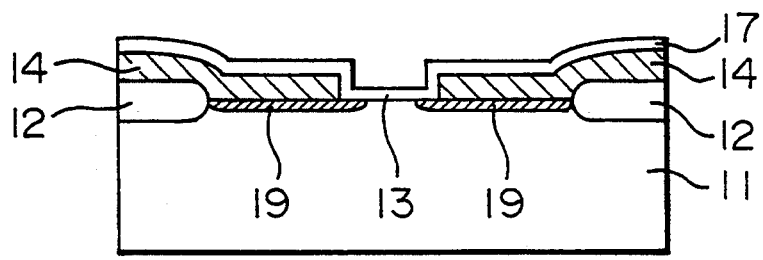

A first gate insulating film 13 is deposited on a part of the semiconductor substrate 11 which is exposed to the outside at the very small gap and an interlayer insulating film 17 is formed on the surface of the second conductivity type polycrystalline silicon layer 14. In this case, each film is formed by the thermal oxidization within a steam atmosphere of 800° C. so as to have a thickness of 100 Å. Also, the first gate insulating film 13 and the interlayer insulating film 17 are formed simultaneously as a unitary film. After this heat treatment and the following high temperature annealing process in a nitrogen atmosphere at 900° C. for 10 minutes, the second conductivity type impurities contained in the second conductivity type first polycrystalline silicon layer 14 are diffused outward into the semiconductor substrate 11 through the contact between the active region and the first polycrystalline layer, thereby forming a second conductivity type diffusion layer 19 with the maximum junction depth of about 0.05 μm (FIG. 2C).

Figure 2D:
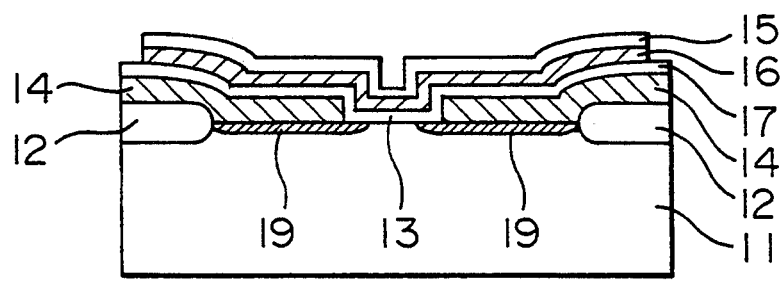

Then, a second conductivity type second polycrystalline silicon layer 16 is deposited on the first gate insulating film 13 and interlayer insulating film 17 by the chemical vapor phase deposition, and patterned to cover the active region. Subsequently, a second gate insulating film 15 is formed to have a thickness of 200 through 250 Å by the chemical vapor phase deposition or thermal oxidization (FIG. 2D).

Figure 2E:
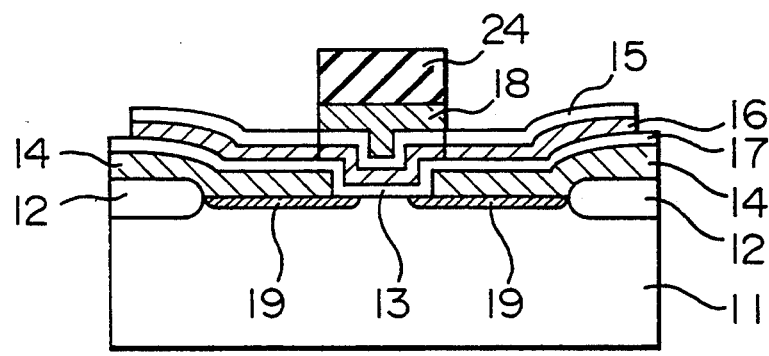

A second conductivity type third polycrystalline silicon layer 18 is deposited on the second gate insulating layer 15 by the chemical vapor phase deposition, and patterned to form a control gate electrode (FIG. 2E).

Figure 2F:
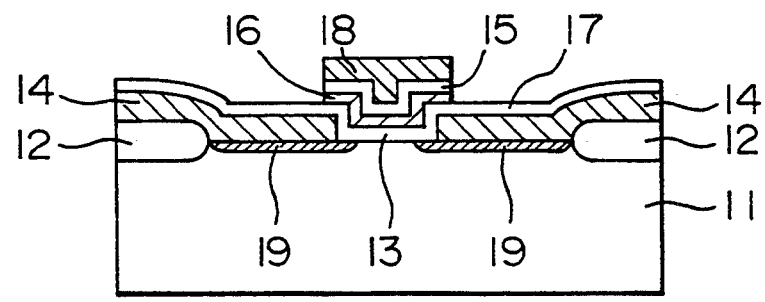

The photoresist 24 is deposited over the patterned second conductivity type third polycrystalline silicon layer 18, and the second gate insulating film 15 and second conductivity type second polycrystalline silicon layer 16 are successively patterned by the anisotropic dry etching process using the second conductivity type third polycrystalline silicon layer 18 as a mask (FIG. 2F).

Then, an insulating film 22 is deposited over the first conductivity type semiconductor substrate 11 by the well-known chemical vapor phase deposition, and contact holes are formed to penetrate the insulating film 22 and the first gate insulating film 13 at selected portions thereof and reach corresponding parts of the surface of the second conductivity type first polycrystalline silicon layer 14. An aluminum electrode 23 is formed to extend into each of the holes and contact with the surface of the second conductivity type first polycrystalline silicon layer 14, thus completing the semiconductor memory device of the structure shown in FIG. 1.

According to the nonvolatile semiconductor memory device of the invention as shown in FIG. 1, since the second conductivity type first polycrystalline silicon layer 14 is formed on the entire surface of the second conductivity type diffusion layer 19, and the aluminum electrode 23 is connected to the second conductivity type first polycrystalline silicon layer 14, the whole surface of the second conductivity type diffusion layer 14, which is in contact with the active region, acts as the contact region.

Since the second conductivity type diffusion layer 19 formed in the active region is very thin, it is hardly diffused into the channel region and thus the tunnel window becomes smaller.

Figure 3:
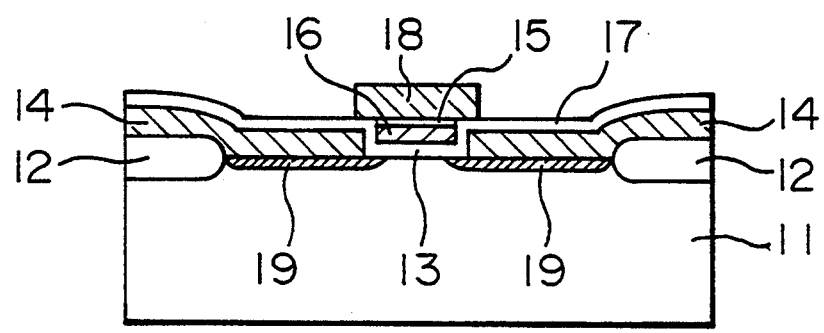
FIG. 3 is a cross-sectional diagram showing the structure of a nonvolatile semiconductor memory device of another embodiment of the invention.
Figure 4:
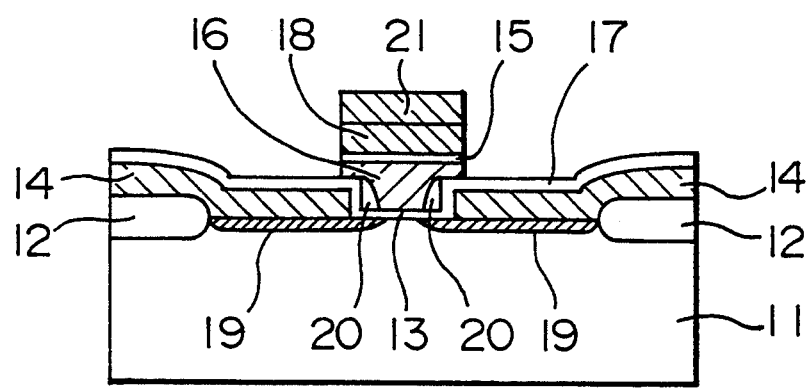
FIG. 4 is a cross-sectional diagram showing the structure of a nonvolatile semiconductor memory device of still another embodiment of the invention.

One embodiment of the nonvolatile semiconductor memory device of the invention has been described above. Another embodiment of the invention is shown in FIG. 3. In this embodiment, the second polycrystalline silicon layer 16 is completely buried within the very small gap mentioned above. FIG. 4 shows still another embodiment of the nonvolatile semiconductor memory device of the invention. In this embodiment, sidewall insulating films 20 are formed on the vertically extending portions of the interlayer insulating film 17 formed in the small gap. This sidewall insulating films 20 are effective to make the channel length smaller than the shortest channel length which can be achieved by the photolithography. In this case, since the very small gap can be further narrowed by an amount corresponding to the thicknesses of the sidewall insulating films 20 as compared with the two previous embodiments, the second gate insulating film 15 is substantially flat as shown in FIG. 4.

In addition, a polycide 21 may be formed on the second conductivity type third polycrystalline layer 18 to make a polycide gate structure as shown in FIG. 4. This polycide 21 is able to reduce the wiring resistance.

While the above embodiments of the invention are explained with reference to a nonvolatile semiconductor memory device, a MOS field-effect transistor can be similarly produced according to this invention.

According to this invention, since the junction depth of the second conductivity type diffusion layer is made smaller than that in the prior art, the lateral diffusion is reduced and thus the short channel effect hardly occurs. Thus, the channel length can be made smaller than that in the prior art, leading to a structure of the nonvolatile semiconductor memory device or MOS field-effect transistor which is advantageous to miniaturization thereof.

Also, according to this invention, since the tunnel window can be formed to be small, the erase efficiency in the flash EEPROM can be increased. In addition, since the junction depth is small, the depletion layers on the source and drain sides spread little to the drain side and source side, respectively so that the punch through phenomenon hardly occurs.

Since the sidewall insulating films are provided on the vertically extending portions of the interlayer insulating layer 17 formed in the very small gap between the second conductivity type first polycrystalline silicon layers 14 as shown in FIG. 4, the very small gap is made narrower by an amount corresponding to the thicknesses of the sidewall insulating films, so that it is possible to further reduce the lower limit of the channel length which can be achieved by the photolithography.

Since the control gate electrodes are of the polycide structure in which the polycide is formed on the second conductivity type third polycrystalline silicon layer as shown in FIG. 4, the wiring resistance can be reduced by the polycide.

Moreover, according to this invention, since the second conductivity type diffusion layer is formed by diffusing the impurities contained in the first polycrystalline layer, it is possible to avoid occurrence of a crystal defect.

Furthermore, according to this invention, since the second conductivity type first polycrystalline silicon layer is formed on the entire surface of the second conductivity type diffusion layer, the whole surface of the second conductivity type diffusion layer which is in contact with the active region is used as a contact region, thus reducing the contact resistance.

I claim:

1. A nonvolatile semiconductor memory device comprising:
   a semiconductor substrate of a first conductivity type;
   an element isolation insulating film formed in said semiconductor substrate so as to define an active region in said semiconductor substrate;
   a pair of first polycrystalline silicon layers including impurities of a second conductivity type different from said first conductivity type and formed on a said active region of said semiconductor substrate, said pair of first polycrystalline silicon layers being separated from each other by a small gap:
   a pair of diffusion layers of said second conductivity type formed in those regions of said semiconductor substrate which are in contact with said pair of first polycrystalline silicon layers by diffusing the impurities included in said first polycrystalline silicon layers, respectively;
   an interlayer insulating film formed to cover said pair of second conductivity type first polycrystalline silicon layers and a part of said semiconductor substrate which is exposed to an outside at said small gap between said first polycrystalline silicon layers, a portion of said interlayer insulating film which covers the part of said semiconductor substrate exposed to the outside at said small gap serving as a first gate insulating film;
   a floating gate electrode formed on said interlayer insulating film so as to cover said very small gap;
   a second insulating film formed on said floating gate electrode; and
   a control gate electrode formed on said second gate insulating film.

2. A nonvolatile semiconductor memory device according to claim 1, wherein said floating gate electrode is a polycrystalline silicon layer of said second conductivity type.

3. A nonvolatile semiconductor memory device according to claim 1, wherein said control gate electrode has a double layer structure of a second conductivity type polycrystalline silicon layer and a polycide layer.

4. A nonvolatile semiconductor memory device according to claim 1, wherein said floating gate electrode is a second conductivity type polycrystalline silicon layer buried in said small gap.

5. A nonvolatile semiconductor memory device according to claim 1, further comprising a sidewall insulating film formed on each of vertically extending portions of said interlayer insulating film formed in said small gap.

6. A nonvolatile semiconductor memory device according to claim 1, wherein each of said pair of diffusion layers has a depth of no more than 0.05 $\mu$m in said substrate.

7. A nonvolatile semiconductor memory device according to claim 1, further comprising a second interlayer insulating film which covers said control gate electrode and said first-mentioned interlayer insulating film, and a metal layer provided on said second interlayer insulating film, said metal layer extending through holes which are formed to penetrate said first and second interlayer insulating films to be in contact with said first polycrystalline silicon film.

8. A MOS field-effect transistor comprising:
a semiconductor substrate of a first conductivity type;
a pair of first polycrystalline silicon layers of a second conductivity type different from said first conductivity type formed on said semiconductor substrate, said pair of first polycrystalline silicon layers being separated from each other by a small gap;
a pair of diffusion layers of said second conductivity type formed in those regions of said semiconductor substrate which are in contact with said pair of first polycrystalline silicon layers, respectively;
a first gate insulating film formed to cover said pair of first polycrystalline silicon layers of said second conductivity type and a part of said semiconductor substrate which is exposed to an outside at said small gap; and
a gate electrode formed on said first gate insulating film,
wherein said gate electrode includes a floating gate formed on said first gate insulating film, a second gate insulating film formed on said floating gate, and a control gate formed on said second gate insulating film.

9. A MOS filed-effect transistor according to claim 8, further comprising a sidewall insulating film formed on each of vertically extending portions of said first gate insulating film formed in said small gap.

10. A MOS field-effect transistor according to claim 8, wherein each of said pair of diffusion layers has a depth of no more than 0.05 $\mu$m in said substrate.

11. A MOS field-effect transistor according to claim 8, further comprising:
an interlayer insulating film which covers said gate electrode and said first gate insulating film, and a metal layer provided on said interlayer insulating film, said metal layer extending through holes which are formed to penetrate said interlayer insulating film and said first gate insulating film to be in contact with said first polycrystalline silicon layers.

* * * * *